US012685097B2

(12) United States Patent
Bertrand et al.

(10) Patent No.: US 12,685,097 B2
(45) Date of Patent: Jul. 14, 2026

(54) METHOD FOR MANUFACTURING A SEMICONDUCTOR-ON- INSULATOR SUBSTRATE FOR RADIOFREQUENCY APPLICATIONS

(71) Applicant: Soitec, Bernin (FR)

(72) Inventors: Isabelle Bertrand, Bernin (FR); Walter Schwarzenbach, Saint Nazaire les Eymes (FR); Frédéric Allibert, Grenoble (FR)

(73) Assignee: Soitec, Bernin (FR)

( * ) Notice: Subject to any disclaimer, the term of this patent is extended or adjusted under 35 U.S.C. 154(b) by 585 days.

(21) Appl. No.: 17/998,894

(22) PCT Filed: May 18, 2021

(86) PCT No.: PCT/FR2021/050874
§ 371 (c)(1),
(2) Date: Nov. 15, 2022

(87) PCT Pub. No.: WO2021/234280
PCT Pub. Date: Nov. 25, 2021

(65) Prior Publication Data
US 2023/0215760 A1     Jul. 6, 2023

(30) Foreign Application Priority Data
May 18, 2020     (FR) ..................................... F2004970

(51) Int. Cl.
*H10P 90/00*          (2026.01)
*H10W 10/10*          (2026.01)
(52) U.S. Cl.
CPC ....... *H10P 90/1916* (2026.01); *H10W 10/181* (2026.01)

(58) Field of Classification Search
CPC ............. H01L 21/76254; H01L 21/304; H01L 21/306; H01L 21/3105;
(Continued)

(56) References Cited

U.S. PATENT DOCUMENTS 6,171,931 B1     1/2001  Murari et al.
6,375,738 B1 *   4/2002  Sato .................... H10P 90/1924
                                                                  117/89
(Continued)

FOREIGN PATENT DOCUMENTS

CN          101425521 A     5/2009
CN          102903607 A     1/2013
(Continued)

OTHER PUBLICATIONS

Taiwanese Office Action and Search Report for Application No. 110117326 dated Jun. 28, 2024, 10 pages with machine translation.
(Continued)

*Primary Examiner* — Mohsen Ahmadi
(74) *Attorney, Agent, or Firm* — Traskbritt.com

(57)          ABSTRACT
A method for manufacturing a semiconductor-on-insulator substrate for radiofrequency applications, comprises: providing a P-doped semiconductor donor substrate; forming a sacrificial layer on the donor substrate; implanting atomic species through the sacrificial layer so as to form in the donor substrate an area of embrittlement defining a thin semiconductor layer that is to be transferred; removing the sacrificial layer from the donor substrate after the implantation; providing a supporting semiconductor substrate having an electrical resistivity greater than or equal to 500 Ω·cm; forming an electrically insulating layer on the supporting substrate; bonding the donor substrate on the supporting substrate, the thin semiconductor layer and the electrically insulating layer being at the interface of the
(Continued)

bonding; detaching the donor substrate along the area of embrittlement so as to transfer the thin semiconductor layer from the donor substrate onto the supporting substrate.

13 Claims, 4 Drawing Sheets

(58) Field of Classification Search
CPC ......... H01L 21/321–322; H01L 21/324; H01L 21/265; H10P 90/12; H10P 90/1916; H10W 10/181
See application file for complete search history.

(56) References Cited

U.S. PATENT DOCUMENTS

| | | | | |
|---|---|---|---|---|
| 6,884,696 | B2 * | 4/2005 | Aga | H01L 21/76254 |
| | | | | 438/459 |
| 2003/0040163 | A1 | 2/2003 | Yokokawa et al. | |
| 2005/0093100 | A1 * | 5/2005 | Chen | H10P 90/1916 |
| | | | | 257/E31.127 |
| 2007/0048971 | A1 * | 3/2007 | Endo | H10W 10/011 |
| | | | | 438/459 |
| 2007/0148910 | A1 | 6/2007 | Neyret et al. | |
| 2008/0261379 | A1 * | 10/2008 | Jinbo | H10D 86/01 |
| | | | | 257/E21.32 |
| 2009/0035920 | A1 * | 2/2009 | Neyret | H01L 21/76254 |
| | | | | 257/E21.568 |
| 2018/0247860 | A1 | 8/2018 | Ishizuka et al. | |
| 2019/0348462 | A1 | 11/2019 | Schwarzenbach et al. | |
| 2020/0127041 | A1 * | 4/2020 | Schwarzenbach | |
| | | | | H01L 21/76254 |

FOREIGN PATENT DOCUMENTS

| | | | |
|---|---|---|---|
| EP | 3358600 | A1 | 5/2019 |
| JP | 2003-347525 | A | 12/2003 |
| JP | 2010-153637 | A | 7/2010 |
| JP | 2010-278160 | A | 12/2010 |
| JP | 2010-278342 | A | 12/2010 |
| JP | 2017-069240 | A | 4/2017 |
| JP | 2020-504462 | A | 2/2020 |
| KR | 10-2010-0129333 | A | 12/2010 |
| TW | 201203358 | A | 1/2012 |
| WO | 2008/093193 | A1 | 8/2008 |

OTHER PUBLICATIONS

Graupner, Robert Kurt, A Study of Oxygen Precipitation in Heavily Doped Silicon, Dissertations and Theses, Portland State University, (1989), Paper 1218, 132 pages.

International Search Report for International Application No. PCT/FR2021/050874 dated Sep. 6, 2021, 2 pages.

International Written Opinion for International Application No. PCT/FR2021/050874 dated Sep. 6, 2021, 6 pages.

International Written Opinion for International Application No. PCT/FR2021/050874 dated Sep. 6, 2021, 5 pages.

Japanese Notice of Reasons for Rejection for Application No. 2022-528094 dated Nov. 5, 2024, 10 pages with English translation.

Taiwanese Office Action and Search Report for Application No. 110117326 dated Jul. 14, 2025, 17 pages with machine translation.

Chinese First Notification of Office Action for Application No. 202180006687.8 dated Apr. 23, 2025, 16 pages with English translation.

Taiwanese Office Action for Application No. 11321232940 dated Nov. 29, 2024, 11 pages with machine translation.

Singapore Written Opinion for Application No. 11202202457X dated Oct. 25, 2025, 6 pages.

Korean Office Action for Application No. 10-2022-7013366 dated Nov. 7, 2025, 12 pages with machine translation.

* cited by examiner

METHOD FOR MANUFACTURING A SEMICONDUCTOR-ON- INSULATOR SUBSTRATE FOR RADIOFREQUENCY APPLICATIONS

CROSS-REFERENCE TO RELATED APPLICATIONS

This application is a national phase entry under 35 U.S.C. § 371 of International Patent Application PCT/FR2021/050874, filed May 18, 2021, designating the United States of America and published as International Patent Publication WO 2021/234280 A1 on Nov. 25, 2021, which claims the benefit under Article 8 of the Patent Cooperation Treaty to French Patent Application Serial No. F2004970, filed May 18, 2020.

TECHNICAL FIELD

The present disclosure relates to a process for fabricating a semiconductor-on-insulator substrate for radiofrequency applications.

BACKGROUND

Radiofrequency electronic components formed in or on semiconductor substrates are particularly sensitive to attenuation phenomena caused by the properties of the substrates.

To this end, use is usually made of semiconductor substrates, in particular, bulk silicon substrates, having a high electrical resistivity, that is to say greater than 500 Sam.

Moreover, FDSOI (acronym for the term "fully depleted semiconductor-on-insulator") substrates appear to be beneficial alternatives to bulk semiconductor substrates. FDSOI substrates comprise, in succession, a carrier substrate, an electrically insulating layer and a semiconductor thin layer in or on which electronic components are able to be fabricated. In an FDSOI substrate, the thickness of the semiconductor layer is thin enough to allow complete depletion of the conduction channel of a transistor formed in the layer. Such a layer typically has a thickness of a few tens of nanometers. The electrically insulating layer, which generally consists of an oxide, is also commonly called BOX (acronym for the term "Buried OXide"). The process for fabricating FDSOI substrates aims to achieve great accuracy with regard to the thickness of the semiconductor layer and of the electrically insulating layer as well as great uniformity of these thicknesses, both within a substrate and from one substrate to another within the same fabrication batch.

It could, therefore, be beneficial, for radiofrequency applications, to form FDSOI substrates with carrier substrates consisting of a semiconductor material with high electrical resistivity.

The process for fabricating an FDSOI substrate is shown schematically in FIGS. 1A to 1C. This process implements a layer transfer from a donor substrate to a carrier substrate, also known by the process name Smart Cut™.

With reference to FIG. 1A, provision is made for a donor substrate 1, for example, made of silicon, covered with an electrically insulating layer 10, for example, made of silicon oxide ($SiO_2$).

As shown schematically by the arrows, an ion species implantation is performed, using, for example, hydrogen and/or helium ions, through the electrically insulating layer 10, so as to form a weakened area 11 in the donor substrate 1. The weakened area 11 defines a thin layer 12 to be transferred.

With reference to FIG. 1B, the donor substrate 1 thus implanted is bonded to a carrier substrate 2 by way of the electrically insulating layer 10, which then performs the function of bonding layer. The carrier substrate 2 may advantageously be a semiconductor substrate, for example, made of silicon, with high electrical resistivity. The bonding may be supplemented by a thermal treatment.

With reference to FIG. 1C, the donor substrate 1 is detached along the weakened area 11, resulting in the thin layer 12 being transferred to the carrier substrate 2. The detachment may be initiated by way of a thermal treatment.

A finishing treatment is then performed on the transferred layer, so as to rectify defects linked to the implantation and to smooth the free surface of the layer.

A semiconductor-on-insulator substrate is thus obtained.

In the case of an FDSOI substrate, the target thickness for the transferred semiconductor layer is between 4 nm and 100 nm, with a maximum variation of ±5 Å with respect to the target value, within each substrate and between the various substrates fabricated using the process. Such uniformity and a very low roughness of the transferred layer may be achieved using a finishing process called "batch anneal," which is a lengthy, high-temperature smoothing process that is advantageously carried out in a furnace in order to treat a plurality of substrates at the same time. Such a "batch anneal" is typically implemented at a temperature between 1150° C. and 1200° C. for a duration of several minutes, generally greater than 15 minutes. This smoothing allows the transferred semiconductor layer to be brought to a level of surface roughness that is compatible with the subsequent fabrication of transistors.

However, this process is detrimental for radiofrequency applications, in particular, for extremely high-frequency applications, that is to say, in a frequency band between 30 and 300 GHz. This frequency band is also called "mmWave."

Specifically, the carrier substrate has a high electrical resistivity and is weakly doped. The carrier substrate is thus generally substantially less doped (for example, boron-doped) than the donor substrate, in other words less doped than the transferred thin layer.

However, due to this difference in doping level between the transferred thin layer and the carrier substrate, under the effect of the high thermal budget of the finishing treatment of the FDSOI substrate and, to a lesser extent, under the effect of the thermal budget of the bonding and/or the detachment, the boron atoms diffuse through the electrically insulating layer into the carrier substrate, leading to a reduction in electrical resistivity in a surface portion extending from the electrically insulating layer.

Now, even if this surface portion extends only a few micrometers deep into the carrier substrate, the drop in electrical resistivity in this area leads to significant electrical losses for mmWave waves.

BRIEF SUMMARY

One aim of the present disclosure is to define a process for fabricating an FDSOI semiconductor-on-insulator substrate suitable for radiofrequency applications, making it possible to keep a high resistivity of the carrier substrate even close to the electrically insulating layer.

To this end, one embodiment of the present disclosure is a process for fabricating a semiconductor-on-insulator substrate for radiofrequency applications, comprising the following steps:

providing a p-doped semiconductor donor substrate, forming a sacrificial layer on the donor substrate, implanting atomic species through the sacrificial layer, so as to form, in the donor substrate, a weakened area defining a semiconductor thin layer to be transferred, removing the sacrificial layer from the donor substrate after the implantation, providing a semiconductor carrier substrate having an electrical resistivity greater than or equal to 500 Ω·cm, forming an electrically insulating layer on the carrier substrate, bonding the donor substrate to the carrier substrate, the semiconductor thin layer and the electrically insulating layer being at the bonding interface, and detaching the donor substrate along the weakened area so as to transfer the semiconductor thin layer from the donor substrate to the carrier substrate.

Thus, by using a bonding layer formed on the carrier substrate and not on the donor substrate, and by removing the sacrificial layer from the donor substrate before the bonding, dopant atoms contained in the bonding layer are prevented from diffusing into the carrier substrate in spite of the difference in doping level between the transferred thin layer and the carrier substrate and from reducing the electrical resistivity of the carrier substrate.

Moreover, the steps of fabricating FDSOI substrates following the bonding remain unchanged, such that this process is compatible with existing industrial fabrication lines.

In some embodiments, forming the sacrificial layer comprises oxidizing the material of the donor substrate.

In some embodiments, removing the sacrificial layer comprises wet-etching the layer.

Optionally, removing the sacrificial layer may furthermore comprise removing a surface portion of the thin layer to be transferred from the donor substrate.

In some embodiments, the donor substrate is boron-doped.

In some embodiments, forming the electrically insulating layer comprises depositing an oxide on the carrier substrate.

In other embodiments, the electrically insulating layer is formed by oxidizing the carrier substrate.

In some embodiments, the electrically insulating layer has a thickness between 10 and 150 nm.

In some embodiments, the transferred semiconductor layer has a thickness between 4 and 100 nm.

BRIEF DESCRIPTION OF THE DRAWINGS

Further features and advantages will become apparent from the following detailed description, with reference to the appended drawings, in which.

To make the figures more clear, the various layers are not necessarily shown to scale.

Reference signs that are identical from one figure to the next denote elements that are similar or at the very least perform the same function.

DETAILED DESCRIPTION

The process for fabricating an FDSOI substrate is modified so as to bond the donor substrate to the carrier substrate by way of an electrically insulating layer formed on the carrier substrate and not on the donor substrate. Unlike the donor substrate, the carrier substrate is not doped or at the very least has a concentration of p-type dopants lower than or equal to $1^E13$ at/cm$^3$. The electrically insulating layer thus does not contain a significant concentration of dopants liable to diffuse into the carrier substrate during subsequent thermal treatments.

An electrically insulating layer remains useful on the surface of the donor substrate to reduce the impact of direct paths of the atomic species during implantation (phenomenon known by the term "channeling"). However, this layer is sacrificial in that it is removed after the implantation, before the bonding.

Figure 1A:
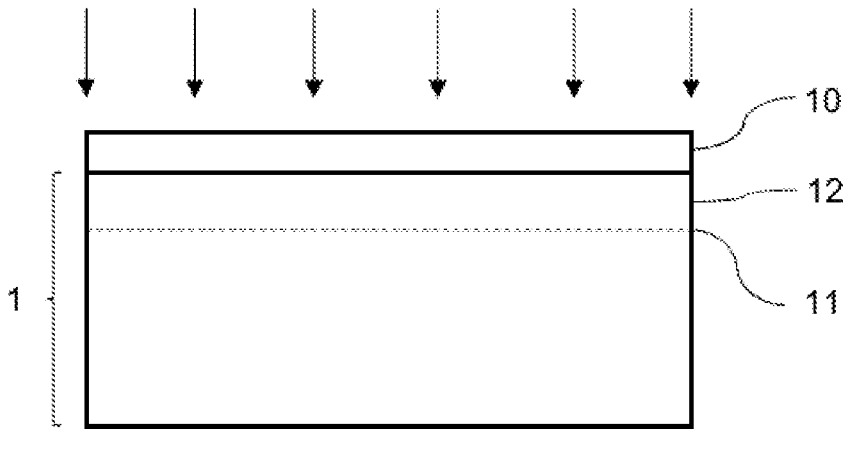
FIG. 1A is a schematic sectional view of the implantation of atomic species through an electrically insulating layer arranged on a donor substrate.
Figure 1B:
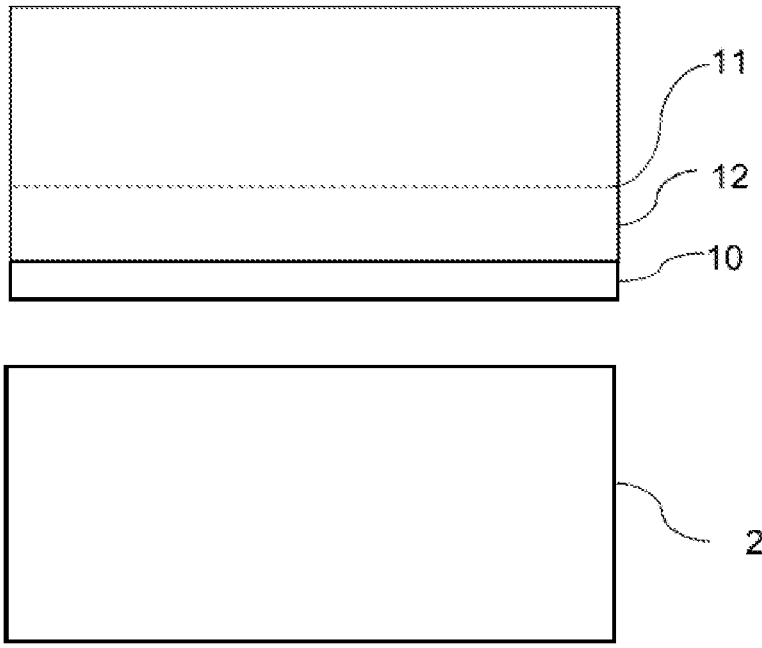
FIG. 1B is a schematic sectional view of the bonding of the donor substrate that has undergone the implantation in FIG. 1A to a carrier substrate.
Figure 1C:
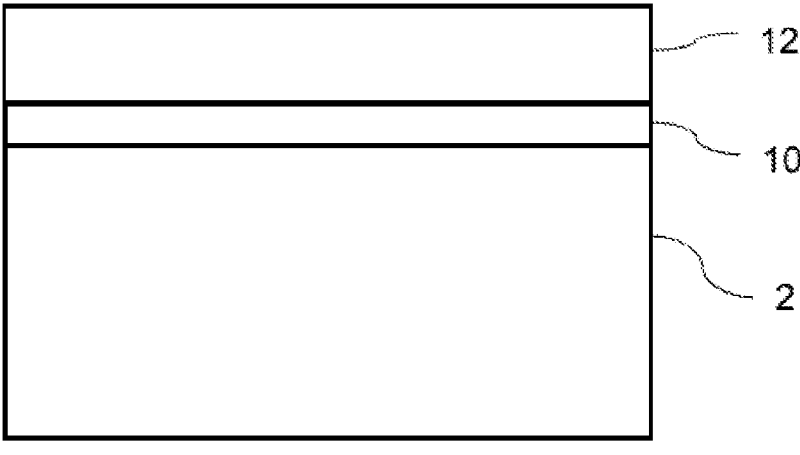
FIG. 1C is a schematic sectional view of the transfer of a thin layer from the donor substrate to the carrier substrate of FIG. 1B.
Figure 2:
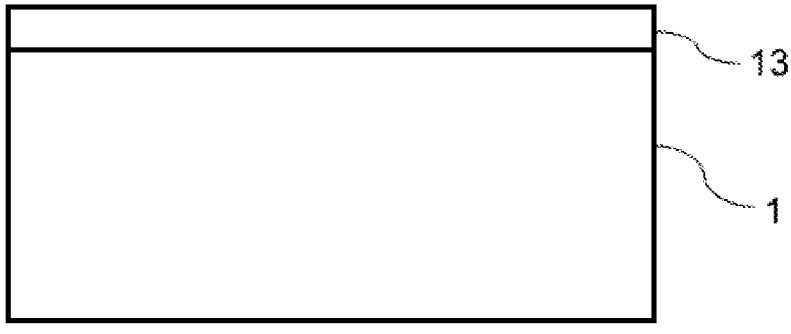
FIG. 2 is a schematic sectional view of the formation of a sacrificial layer on a donor substrate.

FIG. 2 illustrates the formation of such a sacrificial layer 13 on the donor substrate 1.

The donor substrate is a monocrystalline semiconductor substrate, for example, made of silicon. In general, the donor substrate is slightly p-doped. For example, the donor substrate contains boron atoms with a concentration lower than or equal to $1^E15$ at/cm$^3$. A donor substrate doped in this way is specifically less expensive and more standard than an undoped donor substrate.

The sacrificial layer 13 is an electrically conductive layer, in particular, made of an oxide of the material of the donor substrate 1. The sacrificial layer 13 is advantageously formed through thermal oxidation of the donor substrate 1. Such thermal oxidation consumes a surface portion of the material of the donor substrate. To prevent the phenomenon of channeling, the sacrificial layer advantageously has a thickness between 4 and 150 nm, and preferably between 10 and 40 nm.

Figure 3:
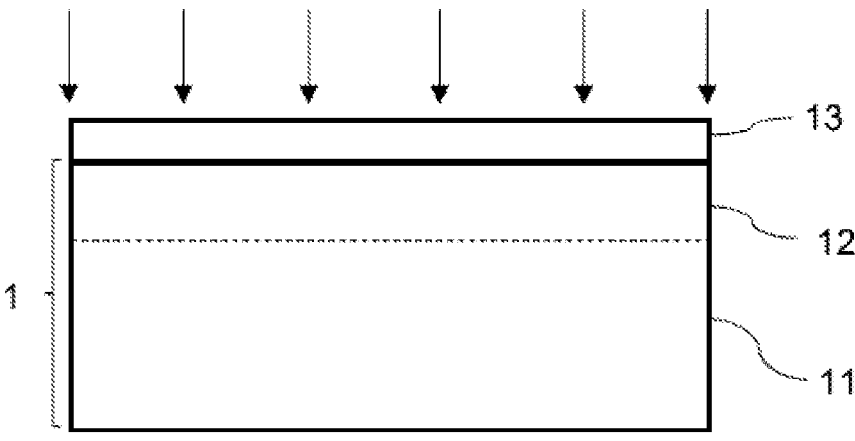
FIG. 3 is a schematic sectional view of the implantation of atomic species into the donor substrate of FIG. 2 through the sacrificial layer.

With reference to FIG. 3, ion species are implanted (shown schematically by the arrows) into the donor substrate 1 through the sacrificial layer.

The implanted species usually comprise hydrogen and/or helium.

The dose and the energy of the implanted species is chosen so as to form a weakened area 11 in the donor substrate 1, at a predetermined depth so as to define, between the sacrificial layer 13 and the weakened area 11, a thin layer 12 to be transferred.

With reference to FIG. 3, the sacrificial layer 13 is then removed. Thus, even though the sacrificial layer contains dopants originating from the donor substrate, it is not present during the subsequent bonding.

The sacrificial layer may be removed, for example, through wet etching. A person skilled in the art has the ability to choose the appropriate etching solution. This etching leaves the surface of the donor substrate sufficiently smooth and free from faults to allow good-quality subsequent bonding.

Removing the sacrificial layer may optionally be followed by removing a surface portion of the thin layer 12 to be transferred. This surface portion, the thickness of which is typically of the order of a few nanometers, may be removed using any appropriate means, for example, through thermal oxidation or through chemical etching, which makes it possible not to degrade the uniformity of the transferred layer. Less preferably, chemical-mechanical polishing could be used.

Figure 4:
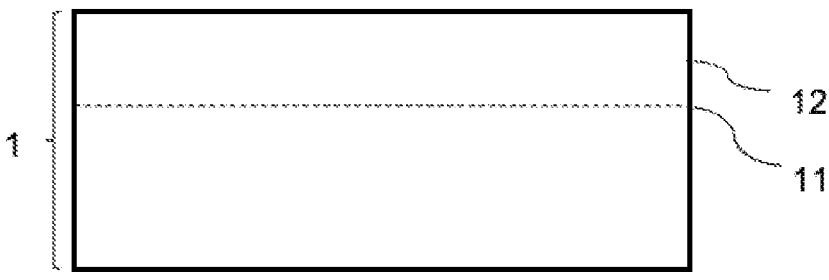
FIG. 4 is a schematic sectional view of the removal of the sacrificial layer from the donor substrate after the implantation of FIG. 3.

With reference to FIG. 4, an electrically insulating layer 20 is also formed on the carrier substrate 2.

The carrier substrate 2 is a semiconductor substrate, for example, made of silicon, having a high electrical resistivity, for example, greater than 500 Ω·cm, preferably greater than or equal to 1000 Ω·cm.

Particularly advantageously, the carrier substrate is a silicon substrate having a high interstitial oxygen content, that is to say a content greater than 20 old ppma (for the definition of the unit old ppma, reference may be made to the dissertation by Robert Kurt Graupner, "A Study of Oxygen Precipitation in Heavily Doped Silicon" (1989), Dissertations and Theses, Paper 1218). Such a substrate is generally denoted using the abbreviation "HiOi." The interstitial oxygen atoms are liable to precipitate under the effect of a thermal treatment, so as to form a large number of defects, called "Bulk Micro Defects" (BMD), formed by oxygen precipitates, which block the dislocations generated during high-temperature thermal treatments, this being advantageous for preserving the crystalline quality of the carrier substrate.

In practice, to use such an HiOi substrate to fabricate an FDSOI substrate, the process comprises, prior to the bonding, a step of thermally treating the carrier substrate at a temperature sufficient to cause the interstitial oxygen to precipitate and form the BMD. Such a thermal treatment may typically be performed in a thermal cycle reaching a temperature of the order of 1000° C. lasting 12 hours.

Moreover, an HiOi substrate generally comprises a large number of crystalline defects called COPs (acronym for the term "crystal originated particles"), which are undesirable in an FDSOI substrate. Advantageously, the fabrication process therefore comprises a "depletion" thermal treatment, aimed at making oxygen diffuse outside the carrier substrate. In practice, this treatment may be performed at the same time as the thermal treatment for precipitating interstitial oxygen, as long as the surface of the carrier substrate is free, that is to say not oxidized, so as to allow oxygen to diffuse outside the substrate. In this case, this precipitation/diffusion thermal treatment should be performed prior to the formation of the electrically insulating layer on the carrier substrate.

As an alternative, a person skilled in the art may choose, for the carrier substrate, a silicon substrate having a low or middling interstitial oxygen content, that is to say a content less than 10, respectively between 10 and 20 old ppma. Such a substrate is generally denoted using the abbreviation "LowOi," respectively, "MidOi." In this case, the above-mentioned precipitation and/or diffusion thermal treatments are not necessary.

The electrically insulating layer 20 is advantageously an oxide layer so as to ensure good-quality bonding with the semiconductor material of the donor substrate 1.

The electrically insulating layer may be formed through a deposition process, in particular, chemical vapor deposition (CVD), or through an oxidation thermal treatment of the carrier substrate.

The thickness of the electrically insulating layer 20 is preferably between 10 and 150 nm.

Figure 5:
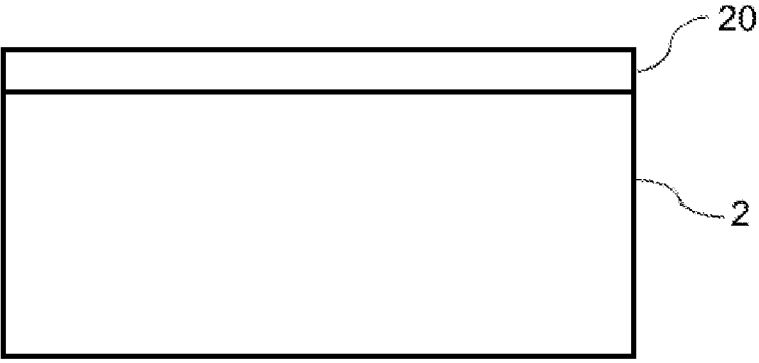
FIG. 5 is a schematic sectional view of the formation of an electrically insulating layer on a carrier substrate.

With reference to FIG. 5, the donor substrate 1 is placed in contact with the receiver substrate 2, the thin layer 12 to be transferred and the electrically insulating layer 20 being at the bonding interface. Molecular adhesive bonding then takes place between the oxide of the layer 20 and the semiconductor material of the thin semiconductor layer 12.

The bonding may possibly be supplemented by a process of preparing the electrically insulating surface, for example, using an oxygen plasma.

As indicated above, the fabrication steps following the bonding remain unchanged in comparison with the existing process for fabricating FDSOI substrates, the process thus being compatible with existing industrial fabrication lines and not affecting the physical and electrical properties of the product.

Figure 6:
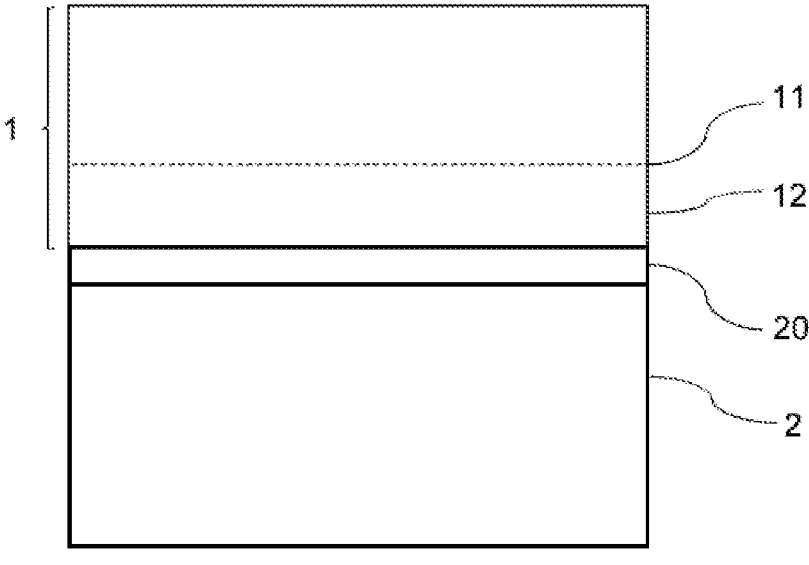
FIG. 6 is a schematic sectional view of the bonding of the donor substrate of FIG. 4 and of the carrier substrate of FIG. 5.

With reference to FIG. 6, the donor substrate 1 is detached along the weakened area 11. In a manner known per se, the detachment may be caused by applying a mechanical stress close to the weakened area, by a thermal treatment or by any other appropriate means.

Figure 7:
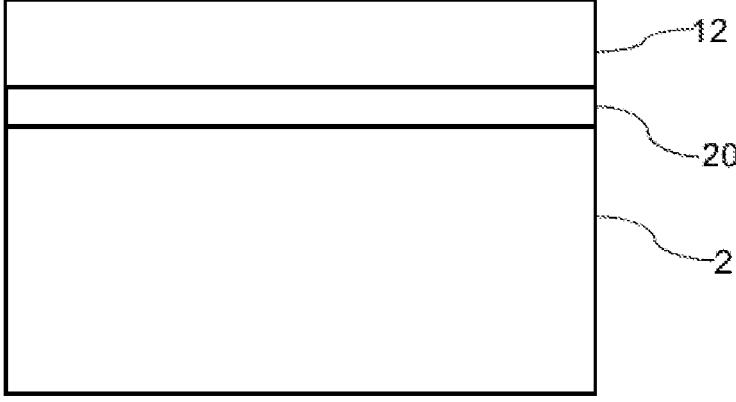
FIG. 7 is a schematic sectional view of the transfer of a thin layer from the donor substrate to the carrier substrate so as to form an FDSOI substrate.

At the end of this detachment, the thin layer 12 has been transferred from the donor substrate to the carrier substrate, and an FDSOI structure is obtained that comprises the carrier substrate 2, the electrically insulating bonding layer 10 and the transferred thin semiconductor layer 12 (cf. FIG. 7).

The structure is then subjected to a finishing treatment conventionally implemented for FDSOI substrates. This finishing treatment includes, in particular, thermal smoothing of the transferred layer ("batch anneal") as mentioned in the introduction.

In some embodiments, this smoothing process consists in placing a batch of FDSOI structures in a furnace, in slowly increasing the temperature from ambient temperature (20° C.) up to a temperature of the order of 1500° C. to 1200° C., and then in keeping the structures at this temperature for a duration of several minutes, preferably greater than 15 minutes.

Removing the sacrificial layer from the donor substrate before the bonding surprisingly makes it possible to attenuate the diffusion of dopants into the carrier substrate and the deterioration of the highly resistive nature of the final structure.

Without wishing to be bound by this hypothesis, it is believed that the formation of the protective oxide layer on the donor substrate could be the reason for a phenomenon of the dopants accumulating at the interface between the donor substrate and the oxide layer, which dopants would diffuse after the donor substrate has been bonded to the carrier substrate. Removing this layer that is rendered sacrificial (and optionally the surface portion of the underlying thin layer to be transferred) thus seems to eliminate or at the very least reduce this accumulation of dopants.

Although the thermal budget of this smoothing process is high enough to allow the dopants present in the structure to diffuse, the dopants in the donor substrate are kept far enough away from the carrier substrate by the electrically insulating layer (which does not contain any such dopants) so as not to diffuse into the carrier substrate. The electrical resistivity of the carrier substrate is, therefore, not affected, even in its portion close to the bonding interface.

The FDSOI structure thus formed is, therefore, fully functional for radiofrequency applications, in particular, in the mmWave band.

The invention claimed is:

1. A method for fabricating a semiconductor-on-insulator substrate for radiofrequency applications, comprising:

providing a p-doped semiconductor donor substrate;

forming a sacrificial layer on the donor substrate;

implanting atomic species through the sacrificial layer, so as to form, in the donor substrate, a weakened area defining a thin semiconductor layer to be transferred;

removing the sacrificial layer from the donor substrate after the implantation;

providing a semiconductor carrier substrate having an electrical resistivity greater than or equal to 500 Ω·cm;

forming an electrically insulating layer on the semiconductor carrier substrate, the electrically insulating layer having a thickness between 10 and 150 nm;

bonding the donor substrate to the semiconductor carrier substrate without an electrically insulating layer on the donor substrate, the thin semiconductor layer and the electrically insulating layer being at a bonding interface;

detaching the donor substrate along the weakened area so as to transfer the thin semiconductor layer from the donor substrate to the semiconductor carrier substrate, the thin semiconductor layer having a thickness between 4 and 100 nm after being transferred; and forming a radiofrequency component on or in the thin semiconductor layer.

2. The method of claim 1, wherein forming the sacrificial layer comprises oxidizing material of the donor substrate.

3. The method of claim 2, wherein removing the sacrificial layer comprises wet-etching the sacrificial layer.

4. The method of claim 3, wherein removing the sacrificial layer further comprises removing a surface portion of the thin semiconductor layer to be transferred from the donor substrate.

5. The method of claim 4, wherein the donor substrate is boron-doped.

6. The method of claim 5, wherein forming the electrically insulating layer comprises depositing an oxide on the semiconductor carrier substrate.

7. The method of claim 5, wherein forming the electrically insulating layer comprises oxidizing the semiconductor carrier substrate.

8. The method of claim 1, wherein removing the sacrificial layer comprises wet-etching the sacrificial layer.

9. The method of claim 1, wherein removing the sacrificial layer further comprises removing a surface portion of the thin semiconductor layer to be transferred from the donor substrate.

10. The method of claim 1, wherein the donor substrate is boron-doped.

11. The method of claim 1, wherein forming the electrically insulating layer comprises depositing an oxide on the semiconductor carrier substrate.

12. The method of claim 1, wherein forming the electrically insulating layer comprises oxidizing the semiconductor carrier substrate.

13. The method of claim 1, wherein forming the radiofrequency component comprises forming a radiofrequency component configured to operate in a frequency range between 30 and 300 GHz.

* * * * *